US 6,660,658 B2

(12) United States Patent
Sandhu et al.

(10) Patent No.: US 6,660,658 B2
(45) Date of Patent: Dec. 9, 2003

(54) TRANSISTOR STRUCTURES, METHODS OF INCORPORATING NITROGEN INTO SILICON-OXIDE-CONTAINING LAYERS; AND METHODS OF FORMING TRANSISTORS

(75) Inventors: Gurtej S. Sandhu, Boise, ID (US); John T. Moore, Boise, ID (US); Neal R. Rueger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/205,235

(22) Filed: Jul. 26, 2002

(65) Prior Publication Data

US 2002/0182812 A1 Dec. 5, 2002

Related U.S. Application Data

(62) Division of application No. 10/050,347, filed on Jan. 15, 2002, which is a division of application No. 09/633,556, filed on Aug. 7, 2000.

(51) Int. Cl.[7] .............................................. H01L 21/31
(52) U.S. Cl. ........................ 438/775; 438/776; 438/777
(58) Field of Search ................................. 438/532, 653, 438/657, 289, 305, 306, 530, 792, 786, 787, 788, 775, 776, 199, 777

(56) References Cited

U.S. PATENT DOCUMENTS

| | | | |
|---|---|---|---|
| 4,605,447 A | * | 8/1986 | Brotherton et al. .......... 438/474 |
| 5,026,574 A | | 6/1991 | Economu et al. |
| 5,032,545 A | | 7/1991 | Doan et al. |
| 5,164,331 A | | 11/1992 | Lin et al. |
| 5,254,489 A | | 10/1993 | Nakata |
| 5,258,333 A | | 11/1993 | Shappir et al. |
| 5,318,924 A | | 6/1994 | Lin et al. |
| 5,330,920 A | | 7/1994 | Soleimani et al. |
| 5,334,554 A | * | 8/1994 | Lin et al. .................... 438/624 |
| 5,378,645 A | | 1/1995 | Inoue et al. |
| 5,382,533 A | | 1/1995 | Ahmad et al. |
| 5,436,481 A | | 7/1995 | Egawa et al. |
| 5,445,999 A | | 8/1995 | Thakur et al. |
| 5,449,631 A | | 9/1995 | Giewont et al. |
| 5,464,792 A | | 11/1995 | Tseng et al. |
| 5,500,380 A | | 3/1996 | Kim |
| 5,518,946 A | | 5/1996 | Kuroda |
| 5,518,958 A | | 5/1996 | Giewont et al. |
| 5,596,218 A | | 1/1997 | Soleimani et al. |
| 5,612,558 A | | 3/1997 | Harshfield |
| 5,619,057 A | | 4/1997 | Komatsu |
| 5,620,908 A | | 4/1997 | Inoh et al. |
| 5,633,036 A | | 5/1997 | Seebauer et al. |
| 5,663,077 A | | 9/1997 | Adachi et al. |

(List continued on next page.)

Primary Examiner—Carl Whitehead, Jr.
Assistant Examiner—Laura Schillinger
(74) Attorney, Agent, or Firm—Wells St. John P.S.

(57) ABSTRACT

The invention encompasses a method of incorporating nitrogen into a silicon-oxide-containing layer. The silicon-oxide-containing layer is exposed to a nitrogen-containing plasma to introduce nitrogen into the layer. The nitrogen is subsequently thermally annealed within the layer to bond at least some of the nitrogen to silicon within the layer. The invention also encompasses a method of forming a transistor. A gate oxide layer is formed over a semiconductive substrate. The gate oxide layer comprises silicon dioxide. The gate oxide layer is exposed to a nitrogen-containing plasma to introduce nitrogen into the layer, and the layer is maintained at less than or equal to 400° C. during the exposing. Subsequently, the nitrogen within the layer is thermally annealed to bond at least a majority of the nitrogen to silicon. At least one conductive layer is formed over the gate oxide layer. Source/drain regions are formed within the semiconductive substrate, and are gatedly connected to one another by the at least one conductive layer. The invention also encompasses transistor structures.

11 Claims, 3 Drawing Sheets

U.S. PATENT DOCUMENTS

| | | |
|---|---|---|
| 5,674,788 A | 10/1997 | Wristers et al. |
| 5,685,949 A | 11/1997 | Yashima |
| 5,716,864 A | 2/1998 | Abe |
| 5,719,083 A | 2/1998 | Komatsu |
| 5,760,475 A | 6/1998 | Cronin et al. |
| 5,763,922 A | 6/1998 | Chau |
| 5,834,372 A | 11/1998 | Lee |
| 5,837,592 A * | 11/1998 | Chang et al. ............... 438/382 |
| 5,837,598 A * | 11/1998 | Aronowitz et al. ......... 438/532 |
| 5,840,610 A | 11/1998 | Gilmer et al. |
| 5,861,651 A | 1/1999 | Brasen et al. |
| 5,885,877 A | 3/1999 | Gardner et al. |
| 5,939,750 A | 8/1999 | Early |
| 5,960,289 A | 9/1999 | Tsui et al. |
| 5,960,302 A | 9/1999 | Ma et al. |
| 5,970,345 A | 10/1999 | Hattangady et al. |
| 5,972,783 A | 10/1999 | Arai et al. |
| 5,972,800 A | 10/1999 | Hasegawa |
| 5,994,749 A | 11/1999 | Oda |
| 5,998,253 A | 12/1999 | Loh et al. |
| 6,033,998 A * | 3/2000 | Aronowitz et al. ......... 438/786 |
| 6,054,396 A | 4/2000 | Doan |
| 6,057,220 A | 5/2000 | Ajmera et al. |
| 6,080,629 A | 6/2000 | Gardner et al. |
| 6,080,682 A | 6/2000 | Ibok |
| 6,087,229 A | 7/2000 | Aronowitz et al. |
| 6,091,109 A | 7/2000 | Hasegawa |
| 6,091,110 A | 7/2000 | Hebert et al. |
| 6,093,661 A | 7/2000 | Trivedi et al. |
| 6,110,780 A | 8/2000 | Yu et al. |
| 6,110,842 A | 8/2000 | Okuno et al. |
| 6,114,203 A | 9/2000 | Ghidini et al. |
| 6,136,636 A | 10/2000 | Wu |
| 6,140,187 A | 10/2000 | DeBusk et al. |
| 6,146,948 A | 11/2000 | Wu et al. |
| 6,174,821 B1 | 1/2001 | Doan |
| 6,184,110 B1 | 2/2001 | Ono et al. |
| 6,197,701 B1 | 3/2001 | Shue et al. |
| 6,201,303 B1 | 3/2001 | Ngo et al. |
| 6,207,532 B1 | 3/2001 | Lin et al. |
| 6,207,586 B1 * | 3/2001 | Ma et al. .................... 438/763 |
| 6,225,167 B1 | 5/2001 | Yu et al. |
| 6,228,701 B1 | 5/2001 | Dehm et al. |
| 6,232,244 B1 | 5/2001 | Ibok |
| 6,255,703 B1 | 7/2001 | Hause et al. |
| 6,268,296 B1 | 7/2001 | Misium et al. |
| 6,274,442 B1 | 8/2001 | Gardner et al. |
| 6,297,162 B1 * | 10/2001 | Jang et al. ................... 438/706 |
| 6,323,114 B1 | 11/2001 | Hattangady et al. |
| 6,331,492 B2 | 12/2001 | Misium et al. |
| 6,362,085 B1 | 3/2002 | Yu et al. |
| 6,399,445 B1 | 6/2002 | Hattangady et al. |
| 6,399,448 B1 | 6/2002 | Mukhopadhyay et al. |
| 6,410,991 B1 | 6/2002 | Kawai et al. |
| 6,413,881 B1 | 7/2002 | Aronowitz et al. |
| 6,436,771 B1 | 8/2002 | Jang et al. |
| 6,450,116 B1 * | 9/2002 | Noble et al. ............ 118/723 R |
| 6,482,690 B2 | 11/2002 | Shibata |
| 6,492,690 B2 | 12/2002 | Ueno et al. |
| 2003/0034518 A1 | 2/2003 | Yoshikawa |

\* cited by examiner

TRANSISTOR STRUCTURES, METHODS OF INCORPORATING NITROGEN INTO SILICON-OXIDE-CONTAINING LAYERS; AND METHODS OF FORMING TRANSISTORS

CROSS REFERENCE TO RELATED APPLICATION

This application is a divisional of U.S. patent application Ser. No. 10/050,347, which was filed on Jan. 15, 2002, which resulted from a divisional application of U.S. patent application Ser. No. 09/633,556, that was filed on Aug. 7, 2000, both of which are which are incorporated by reference herein.

TECHNICAL FIELD

The invention pertains to methods of incorporating nitrogen into silicon-oxide-containing layers, and in particular application pertains to methods of forming transistors. The invention also pertains to transistor structures.

BACKGROUND OF THE INVENTION

It can be desirable to incorporate nitrogen into silicon-oxide-containing layers during formation of semiconductor devices. For instance, it can be desirable to incorporate nitrogen into gate oxides (which typically are silicon dioxide) to reduce dopant penetration through the oxides. Methods have been developed wherein nitrogen is incorporated into a gate oxide during deposition of the gate oxide by including nitrogen species amongst the deposited materials. It can, however, be difficult to control nitrogen location within silicon-oxide-containing layers formed by such techniques. Accordingly, it would be desirable to develop alternative techniques for incorporating nitrogen into silicon-oxide-containing layers.

SUMMARY OF THE INVENTION

In one aspect, the invention encompasses a method of incorporating nitrogen into a silicon-oxide-containing layer. The silicon-oxide-containing layer is exposed to a nitrogen-containing plasma to introduce nitrogen into the layer. The nitrogen is subsequently thermally annealed within the layer to bond at least some of the nitrogen to silicon within the layer.

In another aspect, the invention encompasses a method of forming a transistor. A gate oxide layer is formed over a semiconductive substrate. The gate oxide layer comprises silicon dioxide. The gate oxide layer is exposed to a nitrogen-containing plasma to introduce nitrogen into the layer, and the layer is maintained at less than or equal to 400° C. during the exposing. Subsequently, the nitrogen within the layer is thermally annealed to bond at least a majority of the nitrogen to silicon. At least one conductive layer is formed over the gate oxide layer. Source/drain regions are formed within the semiconductive substrate, and are gatedly connected to one another by the at least one conductive layer.

In yet another aspect, the invention encompasses transistor structures.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
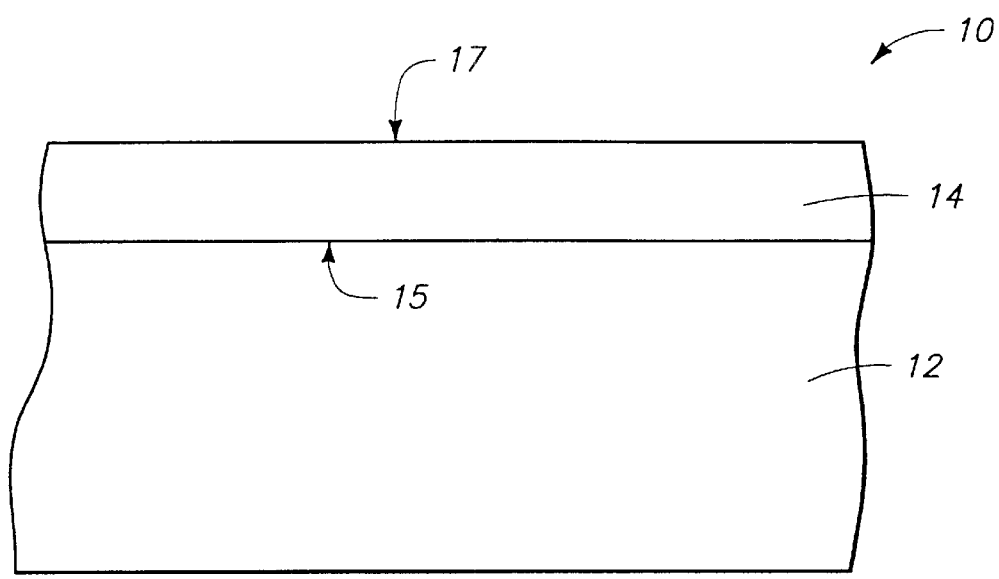
FIG. 1 is a diagrammatic, cross-sectional view of a semiconductor wafer fragment at an initial processing step of a method of the present invention.

A method of the present invention is described with reference to FIGS. 1–6. Referring initially to FIG. 1, a semiconductor wafer fragment 10 comprises a substrate 12 having a silicon-oxide-containing layer 14 formed thereover. Substrate 12 can comprise, for example, monocrystalline silicon lightly-doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Silicon-oxide-containing layer 14 can comprise, for example, any material comprising silicon oxide, including, for example, silicon dioxide, borophosphosilicate glass (BPSG), etc. In a particular embodiment of the present invention, layer 14 comprises silicon dioxide, and is ultimately utilized as a gate oxide layer in a transistor structure. In such embodiment, layer 14 can have a thickness of from about 5 Å to about 60 Å. Oxide layer 14 has a lower surface 15 on substrate 12 and an upper surface 17 above substrate 12 and opposing surface 15.

Figure 2:
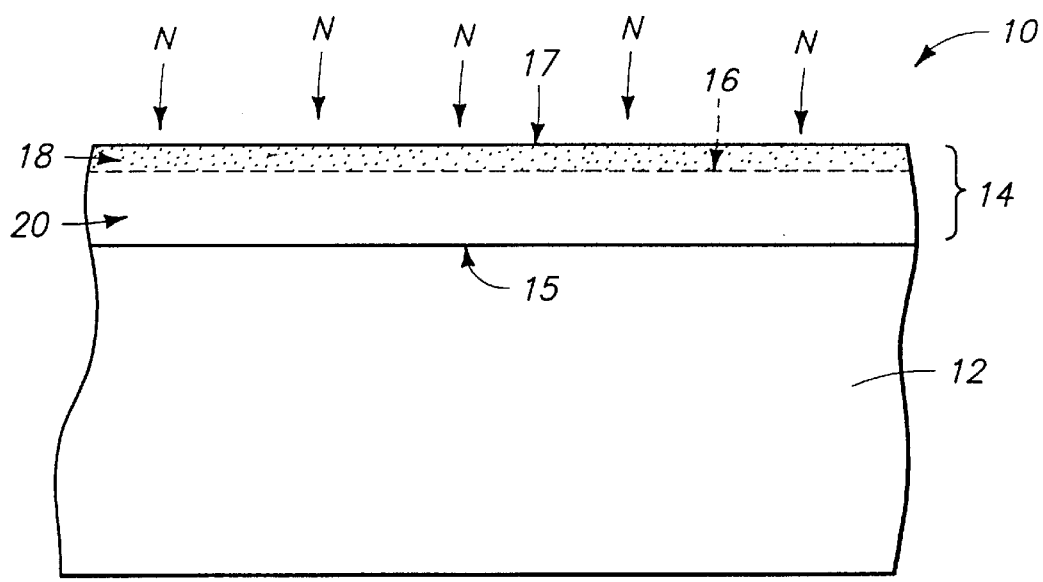
FIG. 2 is a view of the FIG. 1 wafer fragment shown at a processing step subsequent to that of FIG. 1.

Referring next to FIG. 2, oxide-containing layer 14 has nitrogen (shown in FIG. 2 as "N") implanted therein. The nitrogen within layer 14 is shown by stippling, and a dashed line 16 is shown to indicate a lowermost boundary of the implanted nitrogen. A predominant portion of the implanted nitrogen is preferably within an upper half of oxide layer 14, and more preferably within an upper third of oxide layer 14. In particular embodiments, an entirety of the implanted nitrogen is in an upper half of oxide layer 14, and the entirety of the implanted nitrogen can be in an upper third of oxide layer 14, the upper fourth of layer 14, or the upper fifth of layer 14, for example.

An exemplary method of providing nitrogen within oxide layer 14 is to expose layer 14 to activated nitrogen from a nitrogen-containing plasma and thereby introduce nitrogen into layer 14, with the term "activated" indicating that the nitrogen species is different than the form of nitrogen fed to the plasma. An activated nitrogen species can comprise, for example, a nitrogen ion or a nitrogen atom in an energy state higher than its ground state. Introduction of nitrogen into layer 14 forms a nitrogen-enriched upper region 18 of layer 14 and a non-nitrogen-enriched region 20 beneath region 18.

The nitrogen-containing plasma can be formed from, for example, $N_2$, $NH_3$ and/or $N_2O$. The plasma can be predominantly composed of nitrogen-containing species, consist essentially of nitrogen-containing species, or consist entirely of nitrogen-containing species. In exemplary embodiments, layer 14 is maintained at a temperature of less than or equal to 400° C. during the exposure to the nitrogen-containing plasma. Such can alleviate diffusion of nitrogen into a lower half of oxide layer 14. Particular exemplary temperatures can be from 50° C. to 400° C., with a suitable temperature being about 65° C. The nitrogen-containing plasma can be maintained with a power of from about 500 watts to about 5,000 watts during exposure of layer 14 to the plasma, and in particular embodiments can be maintained with a power of from about 500 watts to about 3,000 watts during the exposing. A pressure within a reaction chamber comprising the plasma and oxide layer 14 can be less than about 3 Torr, and can be, for example, from about 5 mTorr to about 10 mTorr. The time of exposure of layer 14 to the nitrogen-containing plasma is preferably for a time of less than or equal to about 1 minute, and in particular embodiments can be for a time of from about 3 seconds to about 1 minute. An exemplary process utilizes an exposure time of from about 10 seconds to about 15 seconds.

Figure 3:
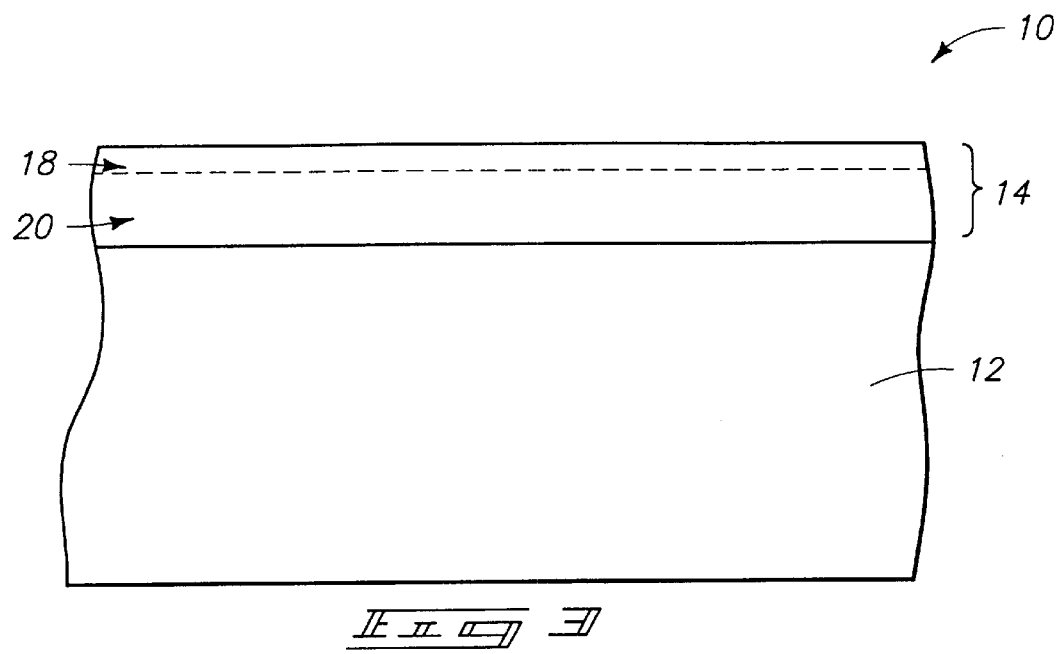
FIG. 3 is a view of the FIG. 1 wafer fragment shown at a processing step subsequent to that of FIG. 2.

Referring to FIG. 3, layer 14 is exposed to an annealing temperature which causes at least some of the nitrogen within region 18 to bond to silicon proximate the nitrogen and accordingly form Si—N bonds which retain the nitrogen within layer 14. The annealing can comprise thermal processing at a temperature of less than 1,100° C. for a time of at least 3 seconds, and can comprise, for example, a temperature of 700° C. for a time of about 30 seconds, or 1,050° C. for a time of about 5 seconds. Alternatively, the annealing can comprise rapid thermal processing (RTP) utilizing a ramp rate of at least 50° C./second to a temperature of less than 1,000° C., with such temperature being maintained for at least about 30 seconds. Suitable processing can include a temperature of about 900° C. for a time of about 60 seconds.

Preferably, a predominant portion of the nitrogen within layer 14 is bonded to silicon of the layer during the annealing, and more preferably, all of the nitrogen within layer 14 is bonded to silicon during the annealing. The bonded nitrogen is precluded from migrating downwardly into layer 14, and accordingly is locked into region 18. In exemplary embodiments, the nitrogen does not migrate below an upper half of oxide region 14 during the annealing, and accordingly, the nitrogen preferably remains within an upper half of layer 14 after the annealing. In other exemplary embodiments, the nitrogen does not migrate below an upper third of layer 14 during the annealing, and accordingly is retained in an upper third of layer 14 after the annealing. Additionally, an entirety of the nitrogen can be in upper fourth of layer 14 after the annealing, or in an upper fifth of layer 14 after the annealing. In particular embodiments of the invention, there is no measurable nitrogen below the top 50% of layer 14, and in exemplary embodiments there is no measurable nitrogen below the top 10 Å of layer 14.

A reason for which it is desired to keep nitrogen in an upper half, or more preferably an upper third, of layer 14 is to alleviate any possibility that nitrogen will migrate through layer 14 and to an upper surface of substrate 12. If nitrogen should reach the upper surface of substrate 12, such can effectively alter a dopant concentration within the effected region of substrate 12, and change electrical characteristics of devices ultimately formed over substrate 12. For instance, if oxide layer 14 is ultimately utilized as a gate oxide, then the region of substrate 12 beneath oxide layer 14 will be a channel region of a transistor gate. If nitrogen migrates through layer 14 and into the channel region, such can affect a threshold voltage of a transistor device, and destroy the device for its intended purpose.

Figure 4:
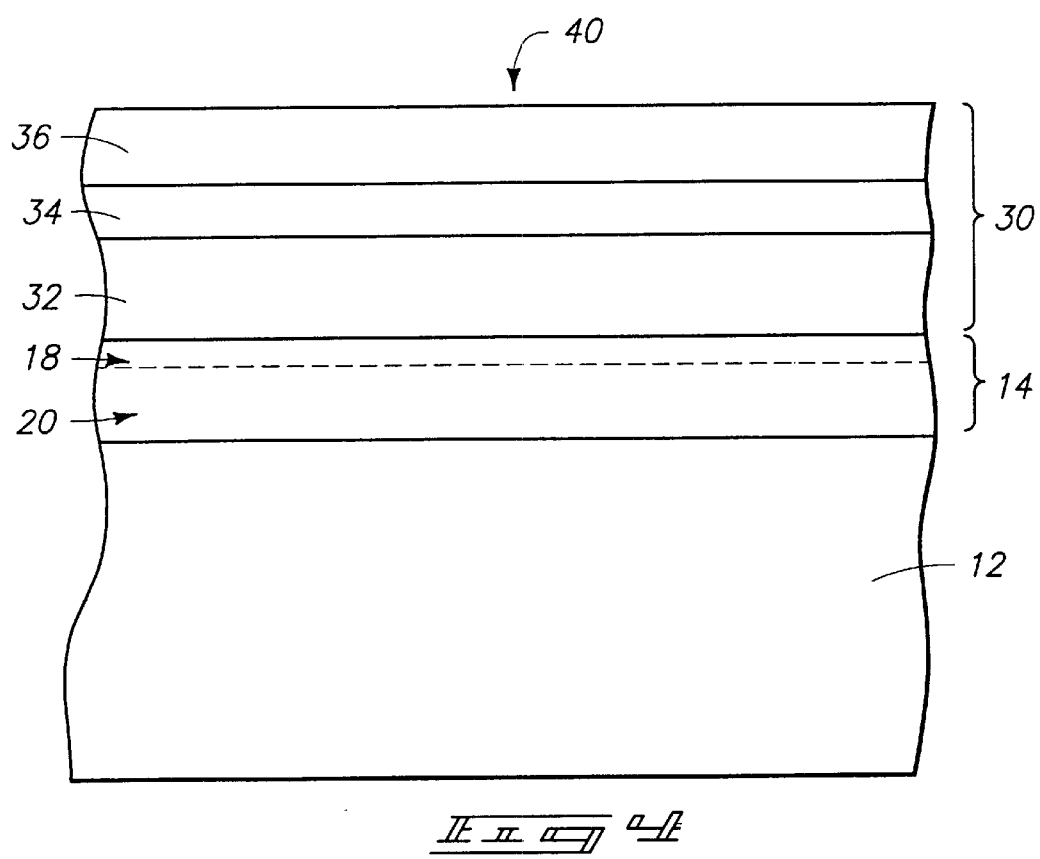
FIG. 4 is a view of the FIG. 1 wafer fragment shown at a processing step subsequent to that of FIG. 3.

Referring to FIG. 4, a stack 30 is formed over layer 14. Stack 30 comprises materials which are ultimately to be patterned into a transistor gate, and accordingly comprises at least one conductive layer. In the shown embodiment, stack 30 comprises two conductive layers, and specifically comprises conductive layers 32 and 34. Stack 30 further comprises an insulative layer 36 formed over conductive layers 32 and 34. Conductive layer 32 can comprise, for example, conductively-doped silicon such as, for example, conductively-doped polysilicon, and can be doped with either n-type or p-type conductivity-enhancing dopant. Conductive layer 34 can comprise, for example, a metal silicide, such as, for example, tungsten silicide or titanium silicide. Insulative layer 36 can comprise, for example, silicon nitride.

If conductive layer 32 comprises conductively-doped silicon, the nitrogen within layer 14 can block migration of dopants from polysilicon 32 into substrate 12. Such can alleviate problems which would otherwise occur if dopant were to migrate through oxide layer 14 and into the substrate 12. Problems which can occur through dopant migration from conductively doped layer 32 into substrate 12 are similar to the problems discussed above which can occur if nitrogen migrates from region 18 of oxide layer 14 into substrate 12, and correspond to problems associated with undesired doping of a channel region formed in substrate 12. Such problems can be particularly severe if p-type doped polysilicon is utilized as a conductive material in forming a PMOS device.

Figure 5:
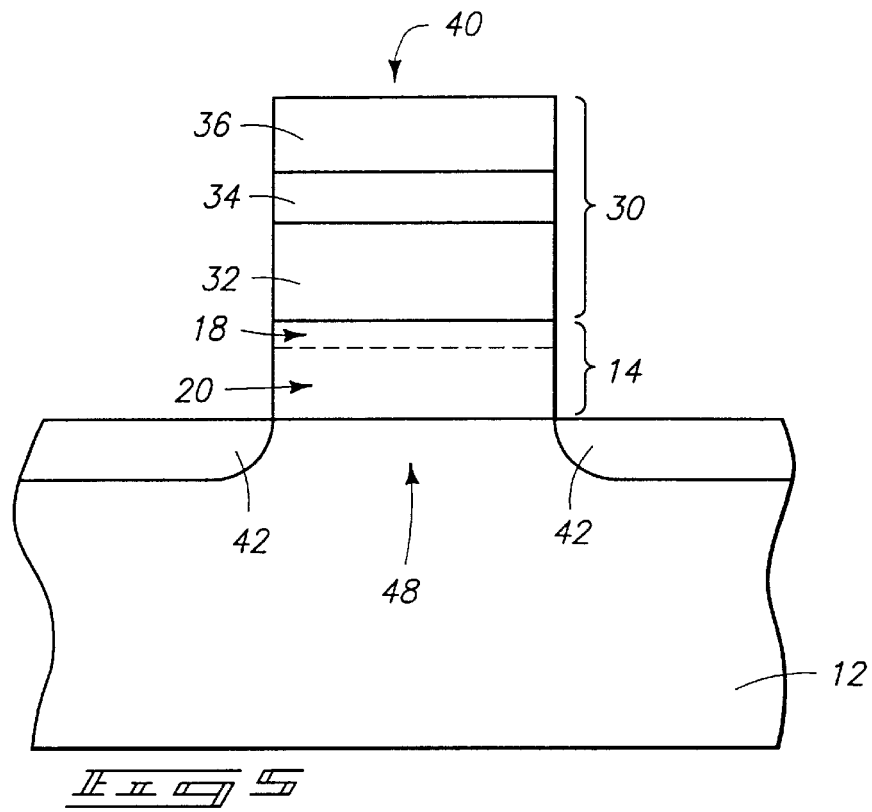
FIG. 5 is a view of the FIG. 1 wafer fragment shown at a processing step subsequent to that of FIG. 4.

Referring to FIG. 5, oxide layer 14 and stack 30 are patterned into a transistor gate structure 40. Such patterning can be accomplished by, for example, photolithographic processing wherein a masking layer (such as photoresist) is formed over stack 30 and a pattern is transferred from the patterned masking layer to stack 30 and oxide 14. The masking layer (not shown) can then be removed after transfer of the pattern to lead to resulting structure 40. It is noted that although oxide layer 14 is shown patterned together with stack 30, the invention encompasses other embodiments wherein only stack 30 is patterned.

Lightly doped diffusion (Ldd) regions 42 are shown formed adjacent structure 40, and can be formed by, for example, implanting a conductivity-enhancing dopant into substrate 12 after forming patterned gate structure 40. Regions 42 can comprise one or both of either n-type conductivity-enhancing dopant or p-type conductivity-enhancing dopant, depending on the type of transistor device which is ultimately to be formed, (i.e., depending on whether the device is to be a PMOS transistor or an NMOS transistor).

Figure 6:
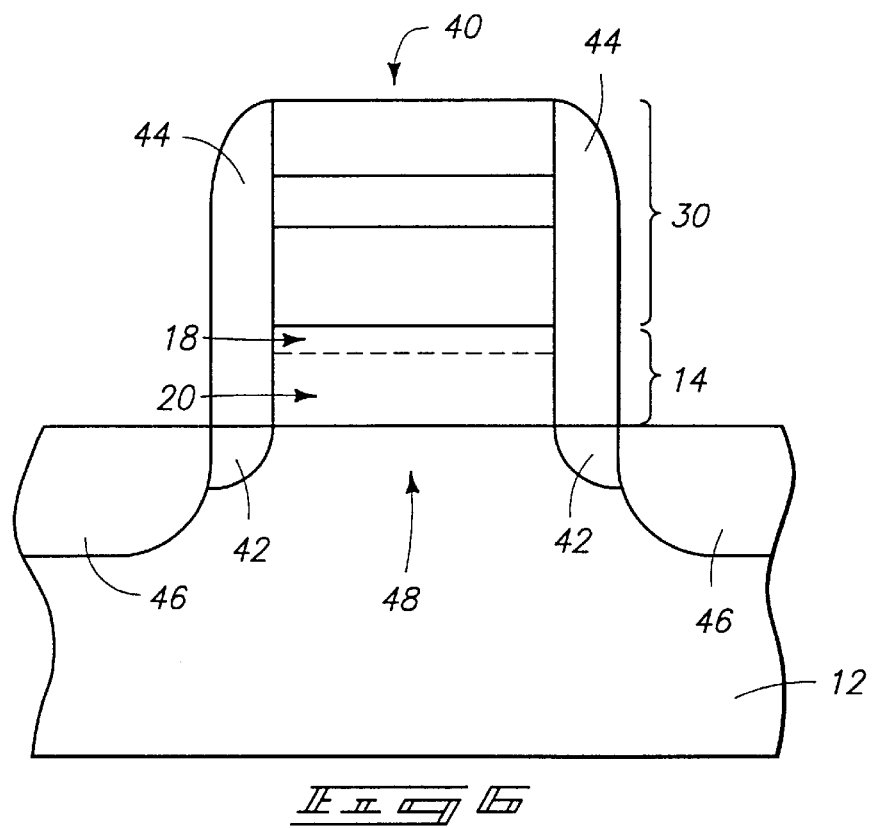
FIG. 6 is a view of the FIG. 1 wafer fragment shown at a processing step subsequent to that of FIG. 5.

Referring to FIG. 6, sidewalls 44 are shown formed adjacent gate structure 40. Sidewalls 44 typically comprise an insulative material, and can comprise, for example, silicon dioxide or silicon nitride. Sidewalls 44 can be formed by, for example, forming a layer of material over substrate 12 and structure 40, and subsequently anisotropically etching the layer of material to leave sidewall spacers 44 along sidewalls of structure 40.

Source/drain regions 46 are shown formed within substrate 12 and adjacent lightly doped diffusion regions 42.

Source/drain regions 46 can be formed by, for example, implanting conductivity-enhancing dopant into substrate 12 after formation of sidewall spacers 44. Source/drain regions 46 are preferably heavily-doped (i.e., doped to a concentration of greater than $1\times10^{19}$ atoms/cm$^3$) with conductivity-enhancing dopant. The conductivity-enhancing dopant can be either n-type or p-type depending on the type of transistor device which is ultimately to be formed.

Gate structure 40, together with regions 42 and 46, defines a field effect transistor. A channel region 48 of such transistor is defined to be beneath oxide layer 14. Structure 40 can be utilized to control channel region 48 so as to gatedly connect a source/drain region on one side of gate 40 with a source/drain region on other side of gate 40.

It is noted that the structures of FIGS. 4–6 are not drawn to scale, and specifically that layer 14 is shown much larger in proportion to layers 32, 34 and 36 than would typically occur in actual structures. Layer 14 is shown in such proportion to permit the portions 18 and 20 of layer 14 to be clearly illustrated in the drawings.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a transistor, comprising:

forming a gate oxide layer over a semiconductive substrate, the gate oxide layer comprising silicon dioxide;

exposing the gate oxide layer to activated nitrogen species from a nitrogen-containing plasma to introduce nitrogen into the layer, the layer being maintained at less than or equal to 400° C. during the exposing;

thermally annealing the nitrogen within the layer to bond at least a majority of the nitrogen to silicon proximate the nitrogen, the thermally annealing comprising rapid thermal processing at a ramp rate of at least about 50° C./sec to a process temperature of less than 1000° C., with the process temperature being maintained for at least about 30 seconds;

forming at least one conductive layer over the gate oxide; and forming source/drain regions within the semiconductive substrate; the source/drain regions being gatedly connected to one another by the conductive layer.

2. The method of claim 1 wherein the conductive layer is formed on the gate oxide.

3. The method of claim 1 wherein the conductive layer is formed after the annealing.

4. The method of claim 1 wherein the source/drain regions are formed after the annealing.

5. The method of claim 1 wherein the conductive layer and source/drain regions are formed after the annealing.

6. The method of claim 1 wherein the plasma is maintained with a power of from about 500 watts to about 5000 watts during the exposing.

7. The method of claim 1 wherein the exposing occurs within a reactor, and wherein a pressure within the reactor is from about 5 mTorr to about 10 mTorr during the exposing.

8. The method of claim 1 wherein the exposing occurs for a time of less than or equal to about 1 minute.

9. The method of claim 1 wherein the annealing comprises thermal processing at temperature of less than 1100° C. for a time of at least 3 seconds.

10. The method of claim 1 wherein the gate oxide layer has a thickness of about 5 angstroms.

11. The method of claim 1 wherein after the exposing, there is no measurable nitrogen in a lowers half of the gate oxide layer.

* * * * *